United States Patent [19]

Wason et al.

[11] Patent Number: 4,477,860
[45] Date of Patent: Oct. 16, 1984

[54] ELECTRODE ARRAY

[75] Inventors: Thomas D. Wason, Raleigh; Charles J. Cain, Greenville, both of N.C.

[73] Assignee: Cain Encoder Company, Greenville, N.C.

[21] Appl. No.: 533,182

[22] Filed: Sep. 19, 1983

[51] Int. Cl.³ ............................ G08C 19/10; G01R 27/26
[52] U.S. Cl. .................................... 361/306; 340/870.37
[58] Field of Search ......................... 340/870.07, 870.37, 340/870.18, 870.28, 870.32; 361/306, 278, 297

[56] References Cited

U.S. PATENT DOCUMENTS

| | | | |
|---|---|---|---|
| 2,892,152 | 6/1959 | Buisson | 340/870.37 X |
| 3,873,916 | 3/1975 | Sterki et al. | 340/870.37 X |
| 4,007,454 | 2/1977 | Cain et al. | 340/310 A X |
| 4,233,593 | 11/1980 | Bigelow | 340/870.37 X |

Primary Examiner—Donald A. Griffin
Attorney, Agent, or Firm—Charles R. Rhodes; Judith E. Garmon

[57] ABSTRACT

In a printed circuit, a plurality of drive electrodes are arranged in an array which is symmetrical about a center detector electrode. A plurality of conductive arms extend outwardly from the center electrode between adjacent electrodes in the array. One of the conductive arms extends to a contact point outside the array and provides electrical communication in the form of an electrical conductive path from the center electrode to the contact point. The remaining arms terminate substantially co-extensive with the radial extremity of the drive electrodes in the array and eliminate inadvertent imbalances in the output signal from the array.

3 Claims, 2 Drawing Figures

ELECTRODE ARRAY

BACKGROUND AND SUMMARY OF THE INVENTION

Transducers in the form of electrode arrays are known in the prior art for various purposes. In general, and for the purpose of this invention, an electrode array is a circular arrangement of electrodes or an arrangement of electrodes which is symmetrical about a center point which electrodes are printed or etched onto a carrier plate. A drive signal of some type is provided to the electrodes in the array. Additionally, the center point includes a center reading or detecting electrode.

One specific example with which the present invention is particularly adapted for use is described in U.S. Pat. No. 4,007,454. A description of an improved version of the electrode array for the aforesaid patent is described in patent application Ser. No. 728,119, filed Sept. 20, 1976 and now U.S. Pat. No. 4,429,308 issued Jan. 31, 1984. In each of these patents, there is provided a plurality of drive electrodes arranged in a symmetrical pattern about a center reading electrode. A drive signal is transmitted to each electrode, and coupled to the center electrode to form an electric field of known characteristics. By placing the electrode array in confronting relation to a rotating member which is immersed in the electric field its position can be detected. In the absence of any disturbance in the field adjacent the array, the signal on the center electrode is zero. However, in the presence of a meter hand or some other imbalance creating situation, an imbalance will be created which can be detected at the center electrode, and a signal representative of the imbalance will be generated.

The problem then exists as to how to get the electrical signal from an electrode in the center of the array to some contact point outside the electrode array from which the signal can be operatively utilized. According to a first approach, a hole was drilled through the center electrode, and a wire attached to the rear thereof or to a post mounted in the rear thereof. The wire then became the conductive path for the signal from the center electrode. This technique proved to be expensive, and difficult to accomplish because of the fragility of the carrier plate upon which the electrodes are deposited. Further, the wire from the center electrode introduced an inherent perturbation or disturbance, and therefore extreme care had to be taken to properly shield the output line. As a result, this approach was determined to be impractical.

While it might appear that a conductive path could be deposited or printed onto the face of the transducer plate, which conductive path or strip would extend between two of the electrodes, it quickly becomes apparent that this approach is unsatisfactory, because it also introduces inadvertent imbalances in the electric field that produce an erroneous signal on the center electrode. The critical balance of the electric field from the surrounding electrodes on the center electrode and its extension(s) must be maintained or else the output signal becomes unusable.

In accordance with the present invention, there is provided a means for satisfactorily transferring the detected signal from the center electrode to a point outside the electrode array without causing signal imbalances on the center electrode due to unbalanced drive signal coupling to the center electrode. Toward this end, one conductive path, strip or arm is deposited on the face of the plate which extends from the center electrode between two adjacent electrodes and out to a contact point. Other secondary conductive arms are deposited on the face of the transducer plate which extend from the center electrode through each of the openings between the other electrodes, so that every opening between electrodes carries a conductive strip. These secondary strips terminate substantially minimally co-extensive with the radial extremities of the electrodes, as it is not necessary to carry them further. That is to say that the strips should not terminate in the area between two electrodes, although they can extend beyond the radial extremities of the adjacent electrodes. Such an arrangement has been proven to not generate extraneous signal imbalances on the center electrode, and the output signal maintains its accuracy.

While the background and summary of the invention have been described in connection with a transducer which generates an electric field surrounding an electrode array which field immerses a meter hand, the position of which is to be detected, there are potentially other electrode arrays with which the present invention is adapted for use. Further, while in the embodiment to be illustrated and described there is only one conductive path from the center electrode to the contact point, it is also possible that other arrangements could be utilized in which two or more conductive paths are live and extend all the way from the center electrode to one or more contact points.

It is therefore an object of the present invention to provide a means whereby an electrical signal can be transmitted from a center electrode which is itself deposited upon a transducer plate substantially at the center of an array of drive electrodes to a point outside the array without causing extraneous imbalances in the signal on the center electrode.

Other objects and a fuller understanding of the invention will become apparent from reading the following detailed description of a preferred embodiment along with the accompanying drawings in which:

FIG. 1 is a plan view of a transducer plate having a simplified electrode array deposited thereon, and illustrating the present invention in association therewith; and FIG. 2 is a plan view of a transducer plate having an alternate embodiment of an electrode array thereon, and illustrating the manner in which the output line is carried from the center electrode to a point outside the array.

DETAILED DESCRIPTION OF A PREFERRED EMBODIMENT

Figure 1:
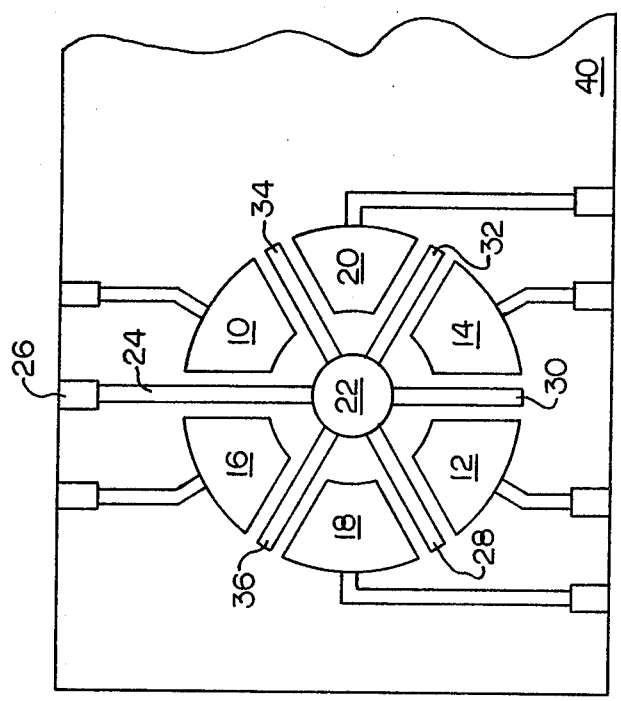

Turning now to the drawings, and particularly to FIG. 1, there is illustrated an electrode array which comprises a plurality of six separate, spaced drive electrodes 10, 12, 14, 16, 18, and 20 arranged in a generally circular pattern about a central reading electrode 22. The drive electrodes 10–20 are each driven by a plurality of drive signals. There results an electric field in space adjacent the electrodes which immerses a meter hand rotating in space adjacent the transducer plate and parallel to the plane of the electrodes. In the absence of such a hand, the electric field is balanced and the signal on the center electrode is zero. The presence of the meter hand causes an imbalance, which can be detected on the center electrode and converted to a signal representative of the position of the meter hand. (See U.S. Pat. No. 4,007,454)

While the drive electrodes 10-20 may be formed on the transducer plate 40 according to a number of conventional techniques, for the purpose of the present invention, the electrodes are etched onto said plate so that the drive electrodes 10-20 and the center electrode 22 are formed as conducting areas with non-conducting or insulating spaces therebetween. As has been discussed hereinabove, the problem is how to get the detected signal from central electrode 22 to a contact point 26 outside the electrode array without inducing perturbations in the detected signal resulting from unbalanced coupling from the drive electrode to the center electrode.

In order to accomplish this result, a first conductive strip, path, or arm 24 is deposited on plate 40 and extends from central electrode 22 to the contact point 26 through the insulating area between drive electrodes 10 and 16. This, in and of itself does not completely solve the problem, because unacceptable imbalances still exist. Therefore, additional conductive strips 28-36 are deposited on plate 40 and extend from the central electrode 22 through the insulating areas between adjacent electrodes. As illustrated, these conductive arms terminate substantially minimally coextensive with the radial extremity of the electrodes 10-20, however, this is not necessary. The strips or arms 28-36 can be longer. Toward this end conductive strip 36 extends between electrodes 16,18; conductive strip 28 extends between electrodes 12 and 18; conductive strip 30 extends between electrodes 12 and 14; conductive strip 32 extends between electrodes 14 and 20; and conductive strip 34 extends between electrodes 10 and 20.

Figure 2:
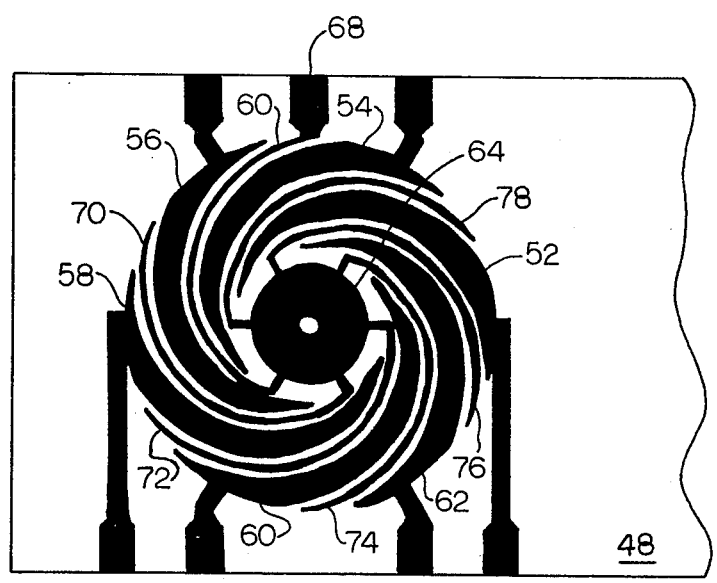

The arrangement shown in FIG. 1 maintains the normal balance on the center electrode through symmetry and provides a pathway for the detected signal from center electrodes 22 to the contact point 26. FIG. 2 is illustrative of a carrier plate 48 having a second embodiment of an electrode array thereon in which the intermediate conductive paths of the present invention are designed for use in connection with an electrode array of the type described in U.S. patent application Ser. No. 728,119. In this embodiment, the concept is the same as in FIG. 1 with the exception that the electrodes 52, 54, 56, 58, 60 and 62 are shaped and interleaved as described and illustrated in the aforesaid U.S. patent application Ser. No. 728,119. Thus, in this embodiment, the conductive paths 66, 70, 72, 74, 76, and 78 are curved between the adjacent interleaved electrodes, rather than being straight as illustrated in FIG. 1. However, the concept and the results are the same.

While a preferred embodiment has been described in detail hereinabove, it is apparent that various changes and modifications might be made to the shape of the electrodes, to the material from which the electrodes are formed, and to the manner in which the electrodes are etched onto the transducer plate, however, such changes would not fall outside the scope of the present invention, which is set forth in the claims below.

What is claimed is:

1. In combination with an electrode array of the type in which a plurality of electrodes are deposited on one surface of a carrier plate symmetrically about a center electrode, which in turn is deposited on the same surface of said carrier plate, and in which it is desired to electrically connect said center electrode with a contact point outside said electrode array without disrupting the detected signal at said center electrode, the improvement comprising:
   (a) at least one conductive strip deposited on said one surface of said carrier plate and extending from said center electrode between two adjacent ones of said plurality of electrodes to said outside point; and
   (b) other conductive strips of the same size and shape as said one conductive strip also deposited on said one surface of said carrier plate and extending from said center electrode between each adjacent ones of the remaining electrodes.

2. The improvement according to claim 1 wherein said other conductive strips terminate substantially minimally coextensively with the radial extremity of the adjacent electrodes.

3. A transducer which, when placed in confronting relation with a rotating member, provides an output signal representative of the member's position, said transducer comprising:
   (a) a plate member which, when mounted adjacent said rotating member, has one surface in confronting relation thereto;
   (b) a plurality of drive electrodes arranged on said one surface in a symmetrical array about a center point, each of said electrodes connected to a source of drive signals to generate an electric field of known characteristics in space adjacent said electrodes;
   (c) a center electrode on said one surface positioned substantially at said center point of said electrode array;
   (d) at least one conductive strip deposited on said one surface extending from said center electrode between an adjacent pair of electrodes to a contact point outside said array;
   (e) other conductive strips substantially of the same size and shape as said one conductive strip also deposited on said one surface of said plate member and extending from said center electrode between adjacent ones of the remaining drive electrodes;
   (f) whereby a conductive path is provided to the exterior of the array for said output signal which does not disturb the balance of coupling of the signals on the drive electrodes to the center electrodes.

* * * * *